United States Patent
Inui

(10) Patent No.: US 9,661,247 B2
(45) Date of Patent: May 23, 2017

(54) SOLID-STATE IMAGING DEVICE, METHOD OF DRIVING SOLID-STATE IMAGING DEVICE, AND IMAGING SYSTEM

(71) Applicant: CANON KABUSHIKI KAISHA, Tokyo (JP)

(72) Inventor: Fumihiro Inui, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/057,351

(22) Filed: Mar. 1, 2016

(65) Prior Publication Data

US 2016/0277690 A1 Sep. 22, 2016

(30) Foreign Application Priority Data

Mar. 19, 2015 (JP) ................. 2015-055877

(51) Int. Cl.
| | |
|---|---|
| *H04N 3/14* | (2006.01) |
| *H04N 5/335* | (2011.01) |
| *H04N 5/359* | (2011.01) |
| *H01L 27/146* | (2006.01) |
| *H04N 5/3745* | (2011.01) |
| *H01L 31/062* | (2012.01) |
| *H01L 31/113* | (2006.01) |

(52) U.S. Cl.
CPC ..... *H04N 5/3591* (2013.01); *H01L 27/14643* (2013.01); *H01L 27/14656* (2013.01); *H04N 5/3598* (2013.01); *H04N 5/3745* (2013.01)

(58) Field of Classification Search
CPC .... H04N 5/3745; H04N 5/355; H04N 5/3741; H04N 5/3742; H04N 5/374; H04N 5/378; H04N 5/3559; H04N 5/37457; H01L 27/14643; H01L 27/14665
USPC .......... 348/302–308; 257/225, 291–292, 432
See application file for complete search history.

(56) References Cited

U.S. PATENT DOCUMENTS

| | | | |
|---|---|---|---|
| 6,320,616 B1 * | 11/2001 | Sauer ................... | H04N 5/3575 250/208.1 |
| 6,778,213 B1 * | 8/2004 | Nakashiba ........ | H01L 27/14603 257/E27.131 |
| 7,564,442 B2 | 7/2009 | Hatano et al. | |

(Continued)

FOREIGN PATENT DOCUMENTS

| | | |
|---|---|---|
| JP | 2006050544 A | 2/2006 |
| JP | 2006186355 A | 7/2006 |

(Continued)

*Primary Examiner* — Kelly L Jerabek
(74) *Attorney, Agent, or Firm* — Fitzpatrick Cella Harper and Scinto

(57) ABSTRACT

A solid-state imaging device includes a pixel including a photoelectric conversion element, a floating diffusion layer, a transfer transistor, a reset transistor, and an amplifier transistor, and a control unit configured to supply a first voltage to a gate of the reset transistor when the charges are accumulated in the photoelectric conversion element, the first voltage being set between a second voltage and a third voltage; subsequently supply the second voltage to the gate of the reset transistor when the reset transistor is turned on in order to reset the potential of the floating diffusion layer, and subsequently supply the third voltage to the gate of the reset transistor when the amplifier transistor outputs the signal based on the potential of the floating diffusion layer.

21 Claims, 4 Drawing Sheets

(56) References Cited

U.S. PATENT DOCUMENTS

| | | | |
|---|---|---|---|
| 8,008,697 B2* | 8/2011 | Mabuchi | H04N 5/3658 257/292 |
| 8,670,490 B2 | 3/2014 | Inui | |
| 2006/0001061 A1 | 1/2006 | Miyatake et al. | |
| 2006/0138489 A1 | 6/2006 | Ahn et al. | |
| 2008/0192135 A1 | 8/2008 | Yamashita | |
| 2011/0242381 A1* | 10/2011 | Sakakibara | H04N 5/355 348/301 |
| 2013/0099291 A1* | 4/2013 | Shimotsusa | H01L 27/14609 257/225 |
| 2013/0181117 A1 | 7/2013 | Shimizu et al. | |
| 2013/0181316 A1* | 7/2013 | Tsukimura | H01L 31/02016 257/443 |
| 2016/0150174 A1* | 5/2016 | Hynecek | H04N 5/37457 348/308 |
| 2016/0165159 A1* | 6/2016 | Hseih | H04N 5/23235 348/273 |
| 2016/0165165 A1* | 6/2016 | Chen | H04N 5/3741 348/308 |

FOREIGN PATENT DOCUMENTS

| | | |
|---|---|---|
| JP | 2008199101 A | 8/2008 |
| JP | 2013150115 A | 8/2013 |

* cited by examiner

SOLID-STATE IMAGING DEVICE, METHOD OF DRIVING SOLID-STATE IMAGING DEVICE, AND IMAGING SYSTEM

BACKGROUND OF THE INVENTION

Field of the Invention

The present invention relates to a solid-state imaging device, a method of driving the solid-state imaging device, and an imaging system.

Description of the Related Art

There has been proposed a solid-state imaging device configured to relax an electric field that is generated between a floating diffusion layer and a gate of a transfer transistor in a period in which charges are accumulated in a photoelectric conversion unit, to thereby maintain the reliability of a gate insulating film of the transfer transistor. In Japanese Patent Application Laid-Open No. 2008-199101, it is disclosed that a voltage of the floating diffusion layer in the accumulation period and a voltage of the floating diffusion layer in a readout period are set to different values, to thereby shorten a period in which a high electric field is applied to the gate insulating film.

SUMMARY OF THE INVENTION

According to one aspect of the present invention, there is provided a solid-state imaging device including a pixel including a photoelectric conversion element, a floating diffusion layer, a transfer transistor configured to transfer charges generated in the photoelectric conversion element to the floating diffusion layer, a reset transistor configured to reset a potential of the floating diffusion layer, and an amplifier transistor configured to output a signal based on the potential of the floating diffusion layer, and a control unit configured to supply a first voltage to a gate of the reset transistor when charges are accumulated in the photoelectric conversion element, the first voltage being a voltage between a second voltage and a third voltage, subsequently supply the second voltage to the gate of the reset transistor when the reset transistor is turned on in order to reset the potential of the floating diffusion layer, and subsequently supply the third voltage to the gate of the reset transistor when the amplifier transistor outputs the signal based on the potential of the floating diffusion layer.

According to another aspect of the present invention, there is provided a solid-state imaging device including a pixel including: a photoelectric conversion element, a floating diffusion layer, a transfer transistor configured to transfer charges generated in the photoelectric conversion element to the floating diffusion layer, a reset transistor configured to reset a potential of the floating diffusion layer, and an amplifier transistor configured to output a signal based on the potential of the floating diffusion layer, and a control unit configured to supply a first voltage to a gate of the reset transistor when charges are accumulated in the photoelectric conversion element, the first voltage being a voltage between a second voltage and a third voltage, subsequently supply the second voltage to the gate of the reset transistor when the reset transistor is turned on in order to reset the potential of the floating diffusion layer, and subsequently supply the third voltage to the gate of the reset transistor when the transfer transistor is transferring the charges.

According to further another aspect of the present invention, there is provided a method of driving a solid-state imaging device including a pixel including a photoelectric conversion element, a floating diffusion layer, a transfer transistor configured to transfer charges generated in the photoelectric conversion element to the floating diffusion layer, a reset transistor configured to reset a potential of the floating diffusion layer, and an amplifier transistor configured to output a signal based on the potential of the floating diffusion layer, the method including supplying a first voltage to a gate of the reset transistor when charges are accumulated in the photoelectric conversion element, the first voltage being a voltage between a second voltage and a third voltage, subsequently supplying the second voltage to the gate of the reset transistor when the reset transistor is turned on in order to reset the potential of the floating diffusion layer, and subsequently supplying the third voltage to the gate of the reset transistor when the amplifier transistor outputs the signal based on the potential of the floating diffusion layer.

According to further another aspect of the present invention, there is provided a method of driving a solid-state imaging device including a pixel including a photoelectric conversion element, a floating diffusion layer, a transfer transistor configured to transfer charges generated in the photoelectric conversion element to the floating diffusion layer, a reset transistor configured to reset a potential of the floating diffusion layer, and an amplifier transistor configured to output a signal based on the potential of the floating diffusion layer, the method including supplying a first voltage to a gate of the reset transistor when charges are accumulated in the photoelectric conversion element, the first voltage being a voltage between a second voltage and a third voltage, subsequently supplying the second voltage to the gate of the reset transistor when the reset transistor is turned on in order to reset the potential of the floating diffusion layer, and subsequently supplying the third voltage to the gate of the reset transistor when the transfer transistor is transferring the charges.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

According to some embodiments of the present invention, there are provided a solid-state imaging device and a method of driving the same that are capable of suppressing a reduction in image quality due to blooming while maintaining the reliability of a gate insulating film.

Figure 3:
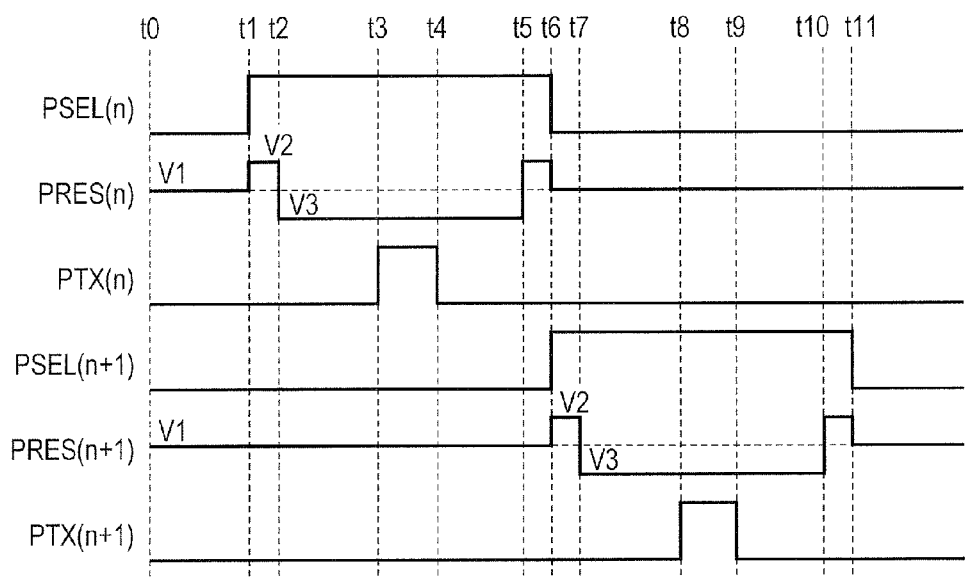
FIG. 3 is a timing chart for illustrating a method of driving the solid-state imaging device according to the first embodiment of the present invention.

With the technology disclosed in Japanese Patent Application Laid-Open No. 2008-199101, image quality may be reduced due to blooming. In the method of driving a solid-state imaging device disclosed in Japanese Patent Application Laid-Open No. 2008-199101, as illustrated in FIG. 3 thereof, the floating diffusion layer is reset with a voltage at a low level of about 0.5 V at the early stage of the charge accumulation period. After that, a reset transistor is kept in an OFF state in most of the charge accumulation period. Thus, a potential of the floating diffusion layer may be reduced due to a leakage current from the floating diffusion layer. Then, a function of the floating diffusion layer as an overflow drain for capturing charges overflowing from a photoelectric conversion unit is deteriorated. As a result, the overflowed charges may flow into photoelectric conversion unit of adjacent pixels, and hence noise components due to blooming may be superimposed on pixel signals.

The solid-state imaging device and the method of driving the same, and an imaging system according to the embodiments of the present invention are described below with reference to the drawings. In the following description, a case of using n-channel MOS transistors as transistors included in pixels is exemplified, but the present invention is also applicable to a case in which the transistors in the pixels are formed of p-channel MOS transistors. In this case, voltages that are applied to a source, a drain, and a gate of the MOS transistor may be appropriately changed from those in the embodiments described below.

First Embodiment

Figure 1:
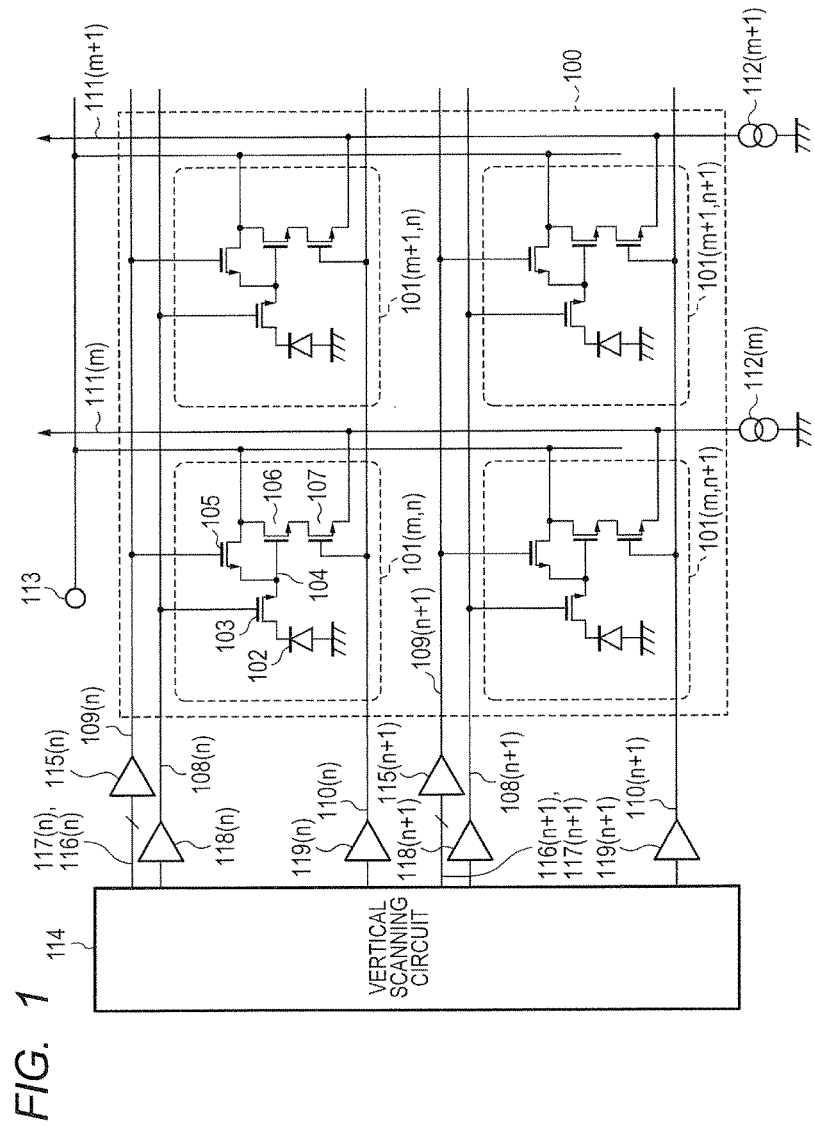
FIG. 1 is a diagram for illustrating a configuration example of a pixel unit of a solid-state imaging device according to a first embodiment of the present invention.
Figure 2:
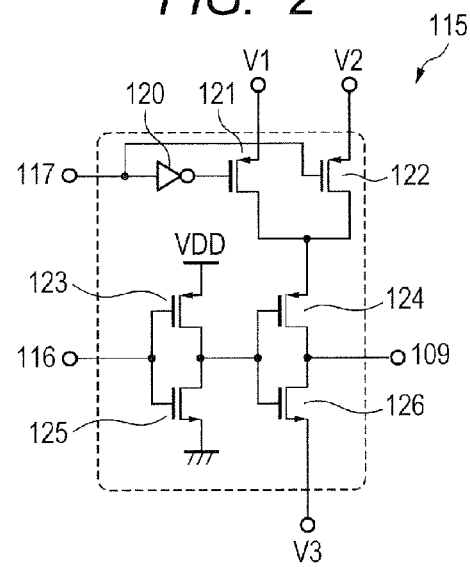
FIG. 2 is a diagram for illustrating an example of a reset control circuit of the solid-state imaging device according to the first embodiment of the present invention.

A solid-state imaging device and a method of driving the same according to a first embodiment of the present invention will be described with reference to FIG. 1 to FIG. 3. FIG. 1 is a diagram for illustrating a configuration example of a pixel unit of the solid-state imaging device according to the present embodiment. FIG. 2 is a diagram for illustrating an example of a reset control circuit of the solid-state imaging device according to the present embodiment. FIG. 3 is a timing chart for illustrating the method of driving the solid-state imaging device according to the present embodiment.

First, the structure of the solid-state imaging device according to the present embodiment is described with reference to FIG. 1 and FIG. 2.

The solid-state imaging device according to the present embodiment includes, as illustrated in FIG. 1, an imaging region 100 in which a plurality of pixels 101 are two-dimensionally arranged in a row direction and a column direction. In FIG. 1, only four pixels 101 positioned at an m-th column and an (m+1)-th column, and an n-th row and an (n+1)-th row are illustrated out of the plurality of pixels 101 forming the imaging region 100. In FIG. 1, a pixel 101(m, n) represents a pixel 101 belonging to the m-th column and the n-th row. Similarly, a pixel 101(m+1, n) represents a pixel 101 belonging to the (m+1)-th column and the n-th row. A pixel 101(m, n+1) represents a pixel 101 belonging to the m-th column and the (n+1)-th row. A pixel 101(m+1, n+1) represents a pixel 101 belonging to the (m+1)-th column and the (n+1)-th row.

Each of the pixels 101 includes a photoelectric conversion element 102, a transfer transistor 103, a reset transistor 105, an amplifier transistor 106, and a select transistor 107. An anode of the photoelectric conversion element 102 serving as a photodiode is connected to a ground voltage line, and a cathode of the photoelectric conversion element 102 is connected to a source of the transfer transistor 103. A drain of the transfer transistor 103 is connected to a source of the reset transistor 105 and a gate of the amplifier transistor 106. A connection node of the drain of the transfer transistor 103, the source of the reset transistor 105, and the gate of the amplifier transistor 106 forms a floating diffusion layer 104. Drains of the reset transistor 105 and the amplifier transistor 106 are connected to a power supply voltage line 113. A source of the amplifier transistor 106 is connected to a drain of the select transistor 107.

In each row of the pixels 101 arranged in the imaging region 100, there are formed a transfer gate control line 108, a reset gate control line 109, and a row select control line 110 that are extended in the row direction. In FIG. 1, for the sake of convenience of the following description, the reference symbol of each control line is added with a suffix corresponding to the row number in the imaging region 100, namely, (n) or (n+1). Each of the transfer gate control line 108, the reset gate control line 109, and the row select control line 110 is a common signal line for the pixels 101 arranged in the row direction. The transfer gate control line 108 is connected to gates of the transfer transistors 103 of the plurality of pixels 101 belonging to a corresponding row. The transfer gate control line 108 is connected to a vertical scanning circuit 114 via a buffer 118. The reset gate control line 109 is connected to gates of the reset transistors 105 of the plurality of pixels 101 belonging to a corresponding row. The reset gate control line 109 is connected to the vertical scanning circuit 114 via a reset control circuit 115 and a plurality of control lines 116 and 117. The row select control line 110 is connected to gates of the select transistors 107 of the plurality of pixels 101 belonging to a corresponding row. The row select control line 110 is connected to the vertical scanning circuit 114 via a buffer 119.

In each column of the pixels 101 arranged in the imaging region 100, a vertical output line 111 extended in the column direction is formed. In FIG. 1, for the sake of convenience of the following description, the reference symbol of the vertical output line 111 is added with a suffix corresponding to the column number in the imaging region 100, namely, (m) or (m+1). The vertical output line 111 is connected to sources of the select transistors 107 of the pixels 101 arranged in the column direction, and is a common signal line for those pixels 101. A constant current source 112 and a column readout circuit (not illustrated) are connected to the vertical output line 111.

The photoelectric conversion element 102 is configured to generate signal charges corresponding to an amount of incident light. The transfer transistor 103 is configured to transfer the charges generated and accumulated in the photoelectric conversion element 102 to the floating diffusion layer 104. The floating diffusion layer 104 forms parasitic capacitors including a p-n junction capacitor with a well, an insulating film capacitor with the gate electrode of the transfer transistor 103, and the like, and is configured to convert the charges transferred via the transfer transistor 103 into voltage corresponding to an amount of the transferred charges. The reset transistor 105 is a switch that is used when the floating diffusion layer 104 is set to a predetermined potential serving as a reference for obtaining a signal voltage level. In general, a power supply voltage is used as the predetermined potential to widen an operation voltage range of the floating diffusion layer 104 for a signal output, to thereby ensure a sufficient dynamic range. Note that, a power supply voltage that is used for resetting the floating diffusion layer 104 is herein sometimes called a reset power supply voltage. The amplifier transistor 106 is configured to output, to the vertical output line 111, a signal corresponding to an amount of charges accumulated in the floating diffusion layer 104. The select transistor 107 is configured to select a pixel 101 to be read out, that is, control connection between the amplifier transistor 106 and the vertical output line 111. The vertical scanning circuit 114 is a control unit configured to supply, to the transfer transistor 103, the reset transistor 105, and the select transistor 107 of each pixel 101, desired control signals required for operating the transistors for each row when a pixel signal is read out from each pixel 101 in the imaging region 100.

FIG. 2 is a circuit diagram for illustrating an example of the reset control circuit 115. The reset control circuit 115 includes, as illustrated in FIG. 2, an inverter 120, p-channel MOS transistors 121, 122, 123, and 124, and n-channel MOS transistors 125 and 126. The p-channel MOS transistor 123 and the n-channel MOS transistor 125 form an inverter circuit of an input stage of a buffer circuit. Further, the p-channel MOS transistor 124 and the n-channel MOS transistor 126 form an inverter circuit of an output stage of the buffer circuit. The inverter 120 and the p-channel MOS transistors 121 and 122 form a power supply switching circuit configured to switch a voltage at a high level to be supplied to the inverter circuit of the output stage of the buffer circuit. Further, the reset control circuit 115 has two input terminals 116 and 117, one output terminal 109, and voltage supply terminals V1, V2, and V3 to which voltages V1, V2, and V3 are input. Note that, the input terminals 116 and 117 are terminals connected to the control lines 116 and 117 connecting the vertical scanning circuit 114 and the reset control circuit 115, and the input terminals are herein denoted by the same reference symbols as the control lines 116 and 117. Similarly, the output terminal 109 is a terminal connected to the reset gate control line 109, and is herein denoted by the same reference symbol as the reset gate control line 109.

The input terminal 116 is connected to a gate of the p-channel MOS transistor 123 and a gate of the re-channel MOS transistor 125. The p-channel MOS transistor 123 has a source connected to a power supply voltage line VDD, and a drain connected to a drain of the n-channel MOS transistor 125. A source of the n-channel MOS transistor 125 is connected to the ground voltage line. With this, the p-channel MOS transistor 123 and the n-channel MOS transistor 125 form the inverter circuit of the input stage of the buffer circuit.

An output terminal of the inverter circuit of the input stage is connected to a gate of the p-channel MOS transistor 124 and a gate of the n-channel MOS transistor 126 that serve as an input terminal of the inverter circuit of the output stage of the buffer circuit. The p-channel MOS transistor 124 has a source connected to drains of the p-channel MOS transistors 121 and 122, and a drain connected to a drain of the n-channel MOS transistor 126. A source of the n-channel MOS transistor 126 is connected to the voltage supply terminal V3. A connection node of the drain of the p-channel MOS transistor 124 and the drain of the n-channel MOS transistor 126 form the output terminal 109.

The input terminal 117 is connected to a gate of the p-channel MOS transistor 122. Further, the input terminal 117 is connected to a gate of the p-channel MOS transistor 121 via the inverter 120. A source of the p-channel MOS transistor 121 is connected to the voltage supply terminal V1. A source of the p-channel MOS transistor 122 is connected to the voltage supply terminal V2.

As described above, the reset control circuit 115 includes the buffer circuit configured to transfer an original logic value input to the input terminal 116, and the power supply switching circuit configured to switch a voltage at a high level to be supplied to the inverter circuit of the output stage of the buffer circuit. The reset control circuit 115 is configured to output any one of the voltage V1, the voltage V2, and the voltage V3 from the output terminal 109 based on two inputs from the vertical scanning circuit 114 to the input terminal 116 and the input terminal 117.

In this case, the voltage V2 is a potential for setting the reset transistor 105 in an ON state. In other words, the voltage V2 is a potential with which an ON resistance of the reset transistor 105 is sufficiently small so that, in a predetermined period, a potential of the source of the reset transistor 105 may become approximately the same as a potential of the drain thereof supplied with the power supply voltage. A ON resistance is, for example, a resistance between a source and a drain of a transistor in an ON state. When described in relation to operation of the solid-state imaging device, the voltage V2 is a voltage that is supplied to the gate of the reset transistor 105 when the reset transistor 105 is turned on in order to reset a potential of the floating diffusion layer 104. When the reset transistor 105 is a depletion type MOS transistor, a similar ON resistance can be obtained even if the voltage V2 is approximately the same as the drain voltage of the reset transistor 105. In both the former case and the latter case with regard to the voltage V2, the floating diffusion layers 104 are set to the same power supply voltage in all the pixels through controlling the resistance of the reset transistors 105 in the ON state (or, the ON resistance of the reset transistor 105), which means that a remaining component of a common-mode rejection ratio is suppressed.

The voltage V3 is a potential with which the reset transistor 105 becomes an OFF state, and at the same time, is set to a sufficiently low potential so that the OFF state may be kept in the operation voltage range of the floating diffusion layer 104 during a signal output. When described in relation to the operation of the solid-state imaging device, the voltage V3 is a voltage that is supplied to the gate of the reset transistor 105 when the amplifier transistor 106 outputs a signal based on the potential of the floating diffusion layer 104. Alternatively, the voltage V3 is a voltage that is supplied to the gate of the reset transistor 105 when the transfer transistor 103 is transferring charges. The voltage V3 as described above is supplied to the gate of the reset transistor 105 when a pixel signal is read out, thereby being capable of ensuring a sufficient dynamic range.

The voltage V1 is a potential lower than the voltage V2, and is set to a high ON resistance state so that the reset transistor 105 may operate in a subthreshold region. That is, the voltage V1, the voltage V2, and the voltage V3 are set so as to satisfy a relationship of V3<V1<V2. When described in relation to the operation of the solid-state imaging device, the voltage V1 is a voltage that is supplied to the gate of the reset transistor 105 when the charges are accumulated in the photoelectric conversion element 102 (charge accumulation period). Now, the reason why the voltage V1 is set to such a value is described below with description of characteristics of a MOS transistor in a subthreshold region.

In general, a drain-source current $I_{ds}$ of a MOS transistor in a subthreshold region is logarithmically proportional to a gate-source voltage $V_{gs}$ thereof. When $I_{ds}$–$V_{gs}$ characteristics are represented as a semi-log graph, the slope of a straight line in the subthreshold region is called an S factor, which is sometimes used as an index for representing characteristics of the transistor. The S factor is about 100 [mV/decade] in general. A rough value of the S factor is determined depending on the structure of the transistor. Further, in the typical MOS transistor, the drain-source current $I_{ds}$ per unit gate width in the subthreshold region is about $1 \times 10^{-7}$ [A/µm] near a threshold voltage, and is reduced in accordance with the S factor with the threshold voltage or lower.

Now, as an example, a case is assumed where the voltage V2 and the power supply voltage are 5 [V], and the voltage V1 is 4 [V]. A case is considered where the drain-source current $I_{ds}$ is $1 \times 10^{-7}$ [A] that is obtained with a voltage near a threshold voltage $V_{th}$, when the voltage V2 is applied to the gate of the reset transistor 105, and when the potential of the floating diffusion layer 104 serving as the source of the reset transistor 105 reaches 5 [V]. In short, the reset transistor 105 is assumed in which $I_{ds}=1 \times 10^{-7}$ [A] is satisfied when $V_{gs}=0$ [V]≈$V_{th}$ is satisfied. Note that, an influence of a change in threshold voltage due to the substrate bias effect (body effect) is herein omitted in order to simplify the description.

When the potential of the gate of the reset transistor 105 transitions from 5 [V] corresponding to the voltage V2 to 4 [V] corresponding to the voltage V1, a change amount $\Delta V_{gs}$ of the gate-source voltage $V_{gs}$ is −1000 [mV]. The drain-source current $I_{ds}$ that the reset transistor 105 may take under this state is expressed as follows when the S factor is 100 [mV/decade].

$$I_{ds} = 1 \times 10^{-7}[A] \times 1 \times 10^{\frac{\Delta V_{gs}}{100}[mV]}$$
$$= 1 \times 10^{-17}[A]$$

A case is assumed where, under this state, a gate leakage current or a blooming current overflowing from a saturated photodiode flows into the floating diffusion layer 104. When those currents are $1 \times 10^{-12}$ [A], a current of $1 \times 10^{-12}$ [A] flows through the reset transistor 105, and the following expression is satisfied.

$$1 \times 10^{-17}[A] = 1 \times 10^{-12}[A] \times 1 \times 10^{\frac{\Delta V_{gs}}{100}[mV]}$$

The change amount $\Delta V_{gs}$ of the gate-source voltage $V_{gs}$, which satisfies this expression, is −500 [mV]. That is, when a current such as a gate leakage current or a blooming current flows into the floating diffusion layer 104, the potential of the floating diffusion layer 104 drops so that the current flowed into the floating diffusion layer 104 and the drain-source current $I_{ds}$ of the reset transistor 105 may be balanced, to thereby attain a predetermined voltage. In other words, the potential of the floating diffusion layer 104 is clipped by the gate of the reset transistor 105, and the potential of the floating diffusion layer 104 does not fall below a value of (gate voltage−threshold voltage $V_{th}$). In the above-mentioned example, the current of $1 \times 10^{12}$ [A] flows into the reset transistor 105 that allows a current of $1 \times 10^{-17}$ [A] to flow therethrough when the potential of the floating diffusion layer 104 is 5 [V], to thereby set the potential of the floating diffusion layer 104 to 4.5 [V].

As described above, through the application of the above-mentioned voltage V1 to the gate of the reset transistor 105, the potential of the floating diffusion layer 104 is set to a potential corresponding to an amount of current flowing into the floating diffusion layer 104. Further, as the potential of the floating diffusion layer 104 becomes higher, a ratio at which a blooming current overflowing from the saturated photodiode flows into the floating diffusion layer 104 becomes higher, and hence it is preferred that the potentials of the floating diffusion layers 104 be kept high except for pixels 101 having especially large current amounts.

For example, in a period in which charges are accumulated in the photoelectric conversion element 102, a state is sometimes established in which a strong electric field is applied between the transfer transistor 103 in the OFF state and the floating diffusion layer 104. In such a case, in a pixel 101 including a transfer transistor 103 having a comparatively large gate leakage current due to variations in manufacturing of the gate insulating film, a gate leakage current flowed into a floating diffusion layer 104 lowers the potential of the floating diffusion layer 104. As a result, the electric field between a gate of the transfer transistor 103 and the floating diffusion layer 104 is relaxed. That is, the electric field between the gate of the transfer transistor 103 and the floating diffusion layer 104 can be relaxed based on a magnitude of the gate leakage current in a self-aligning manner, thereby being capable of contributing to an improvement in endurance reliability of the gate insulating film under the electric field. The floating diffusion layer 104 has a potential kept high, and thus functions as the overflow drain also for a blooming phenomenon in which charges overflowing from a photodiode that has reached a saturated charge amount are leaked to other pixels 101 as false signals. Consequently, deterioration in image quality due to blooming can be suppressed as well. Note that, in a case of a driving method in which the amplifier transistor 106 does not output a signal in a period in which the transfer transistor 103 is being ON, the above-mentioned voltage V3 is applied to the gate of the reset transistor 105 in at least part of the period in which the transfer transistor 103 is being ON. In this case, the voltage V1 is applied to the gate of the reset transistor 105 in the accumulation period, thereby being capable of obtaining an effect of suppressing deterioration in image quality due to blooming.

Note that, when the above-mentioned voltage V3 is applied to the gate of the reset transistor 105, the reset transistor 105 becomes completely in the OFF state, and hence a gate leakage current or a blooming current flows into the floating diffusion layer 104 to continuously lower the potential of the floating diffusion layer 104. Further, when the above-mentioned voltage V2 is applied to the gate of the reset transistor 105, the reset transistor 105 becomes completely in the ON state, and hence the potential of the floating diffusion layer 104 is not varied. Thus, when the voltage V2 or the voltage V3 is applied to the gate of the reset transistor 105, the above-mentioned effect that is obtained when the voltage V1 is applied to the gate of the reset transistor 105 cannot be realized.

Next, the method of driving the solid-state imaging device according to the present embodiment is described with reference to FIG. 1 to FIG. 3. FIG. 3 is a timing chart for illustrating readout operation of pixels in 2 rows of the solid-state imaging device according to the present embodiment. In FIG. 3, a period from time t1 to time t6 is a readout period of pixels in the n-th row, and a period from time t6 to time t11 is a readout period of pixels in the (n+1)-th row. Note that, a period from time t0 to time t1 is last part of a readout period of pixels in an (n−1)-th row. Further, in FIG. 3, a signal PSEL(n) represents a signal level of a row select control line $110(n)$ in the n-th row, and a signal PSEL(n+1) represents a signal level of a row select control line $110(n+1)$ in the (n+1)-th row. A signal PRES(n) represents a signal level of a reset gate control line $109(n)$ in the n-th row, and a signal PRES(n+1) represents a signal level of a reset gate control line $109(n+1)$ in the (n+1)-th row. A signal PTX(n) represents a signal level of a transfer gate control line $108(n)$ in the n-th row, and a signal PTX(n+1) represents a signal level of a transfer gate control line $108(n+1)$ in the (n+1)-th row.

In the period from time t0 to time t1, the row select control lines $110(n)$ and $110(n+1)$, and the transfer gate control lines $108(n)$ and $108(n+1)$ are set to a potential at a low level by the vertical scanning circuit 114. Further, the reset gate control lines $109(n)$ and $109(n+1)$ are set to a potential of the voltage V1 by the vertical scanning circuit 114 via the reset control circuit 115.

Next, at time t1, the vertical scanning circuit 114 changes the signal PSEL(n) of the row select control line $110(n)$ from the potential at the low level to a potential at a high level, to thereby cause the select transistor 107 of the pixel 101 in the n-th row to become the ON state. With this, the pixel 101 in the n-th row becomes a selected state.

At the same time, at time t1, the vertical scanning circuit 114 changes the reset gate control line $109(n)$ from the potential of the voltage V1 to a potential of the voltage V2 with the reset control circuit 115, to thereby cause the reset transistor 105 of the pixel 101 in the n-th row to become the ON state. With this, a power supply voltage being supplied to the drain of the reset transistor 105 (reset power supply voltage) is supplied to the floating diffusion layer 104.

Next, at time t2, the vertical scanning circuit 114 changes the reset gate control line $109(n)$ from the potential of the voltage V2 to a potential of the voltage V3 with the reset control circuit 115, to thereby cause the reset transistor 105 of the pixel 101 in the n-th row to become the OFF state. With this, the floating diffusion layer 104 is separated from the power supply, and reset operation of the floating diffusion layer 104 is thus completed.

Next, in a period from time t2 to time t3, a pixel signal at a level corresponding to a reset potential of the floating diffusion layer 104 (hereinafter referred to as "N signal") is read out. In the period from time t2 to time t3, the select transistor 107 is in the ON state, and hence the source of the amplifier transistor 106 is connected to the vertical output line 111 via the select transistor 107. That is, the amplifier transistor 106 has the source supplied with a bias current from the constant current source 112 via the vertical output line 111 and the select transistor 107, and forms a source follower circuit. With this, the signal at the level corresponding to the reset voltage of the floating diffusion layer 104 (N signal) is amplified by the amplifier transistor 106, and the amplified signal is output to the vertical output line 111 via the select transistor 107. The N signal output to the vertical output line 111 is read out via the column readout circuit (not illustrated) connected to the vertical output line 111.

Next, in a period from time t3 to time t4, the vertical scanning circuit 114 changes the signal PTX(n) of the transfer gate control line $108(n)$ from the potential at the low level to a potential at a high level, to thereby cause the transfer transistor 103 of the pixel 101 in the n-th row to become the ON state. With this, the photoelectric conversion element 102 and the floating diffusion layer 104 are connected to each other via the transfer transistor 103, and signal charges accumulated in the photoelectric conversion element 102 are transferred to the floating diffusion layer 104 via the transfer transistor 103. When the signal PTX(n) of the transfer gate control line $108(n)$ is changed to the potential at the low level at time t4, the floating diffusion layer 104 is separated from the photoelectric conversion element 102, and operation of transferring signal charges to the floating diffusion layer 104 is thus completed. Through the transfer of the signal charges to the floating diffusion layer 104, a voltage is changed in the floating diffusion layer 104 depending on a capacitance thereof and an amount of transferred signal charges. Note that, at time t4 and thereafter, a signal charge accumulation period for a next frame is started in the photoelectric conversion element 102.

Next, in a period from time t4 to time t5, a pixel signal at a level corresponding to the potential of the floating diffusion layer 104 to which the signal charges have been transferred (hereinafter referred to as "S signal") is read out. In the period from time t4 to time t5, the select transistor 107 is in the ON state, and hence the source of the amplifier transistor 106 is connected to the vertical output line 111 via the select transistor 107. That is, the amplifier transistor 106 has the source supplied with a bias current from the constant current source 112 via the vertical output line 111 and the select transistor 107, and forms the source follower circuit. With this, the signal at the level corresponding to the potential of the floating diffusion layer 104 to which the signal charges have been transferred (S signal) is amplified by the amplifier transistor 106, and the amplified signal is output to the vertical output line 111 via the select transistor 107. The S signal output to the vertical output line 111 is read out via the column readout circuit (not illustrated) connected to the vertical output line 111.

Next, in a period from time t5 to time t6, the vertical scanning circuit 114 changes the reset gate control line $109(n)$ from the voltage V3 to the voltage V2 with the reset control circuit 115, to thereby cause the reset transistor 105 of the pixel 101 in the n-th row to become the ON state. With this, the power supply voltage being supplied to the drain of the reset transistor 105 is supplied to the floating diffusion layer 104.

Next, at time t6, the vertical scanning circuit 114 changes the reset gate control line $109(n)$ from the voltage V2 to the voltage V1 with the reset control circuit 115. With this, the floating diffusion layer 104 can have a potential kept at a value corresponding to an amount of current flowing thereinto, and hence deterioration in image quality due to blooming can be prevented. Further, the floating diffusion layer 104 acts so that the electric field between the gate of the transfer transistor 103 and the floating diffusion layer 104 may be relaxed, thereby being capable of suppressing deterioration in gate insulating film.

Further, at the same time, at time t6, the vertical scanning circuit 114 changes the signal PSEL(n) of the row select control line $110(n)$ from the potential at the high level to the potential at the low level, to thereby cause the select transistor 107 of the pixel 101 in the n-th row to become the OFF state. With this, the pixel 101 in the n-th row becomes the unselected state, and the readout operation of the n-th row is finished.

Further, at the same time, at time t6, the vertical scanning circuit 114 changes the signal PSEL(n+1) of the row select control line $110(n+1)$ from the potential at the low level to the potential at the high level, to thereby cause the select transistor 107 of the pixel 101 in the (n+1)-th row to become the ON state. With this, the pixel 101 in the (n+1)-th row becomes the selected state.

After that, in the period from time t6 to time t11, the readout operation of the pixel 101 in the (n+1)-th row is performed similarly to the readout operation of the pixel 101 in the n-th row in the period from time t1 to time t6. Also for the pixels 101 in an (n+2)-th row or thereafter, the readout operation is performed in sequence with a similar procedure.

As described above, in the method of driving the solid-state imaging device according to the present embodiment, in the signal charge accumulation period except for the period in which the readout operation is performed, the potential of the gate of the reset transistor 105 is set to the voltage V1. For example, in the case of the n-th row of FIG. 3, in the signal charge accumulation period, the potential of the gate of the reset transistor 105 is set to the voltage V1 in the period before time t1 and the period from time t6 and thereafter. It is therefore possible to shorten a period in which a strong electric field is applied between the gate of the transfer transistor 103 and the floating diffusion layer 104.

Note that, when a voltage that appears in the floating diffusion layer 104 in the readout period of the N signal is represented by $V_{fd1}$, and a voltage that appears in the floating diffusion layer 104 in the readout period of the S signal is represented by $V_{fd2}$, a voltage difference therebetween ($V_{fd1}-V_{fd2}$) can be expressed as follows. In this case, an amount of signal charges transferred to the floating diffusion layer 104 is represented by Q, and the capacitance of the floating diffusion layer 104 is represented by $C_{fd}$.

$$V_{fd1}-V_{fd2}=Q/C_{fd}$$

That is, when an output of the amplifier transistor 106 corresponding to the potential of the floating diffusion layer 104 is to be obtained, accurate signal charges can be obtained through sampling of a signal having a voltage based on $V_{fd1}$ and a signal having a voltage based on $V_{fd2}$, and extraction of a difference therebetween. In particular, when there is used a photoelectric conversion element 102 capable of transferring all generated signal charges to the floating diffusion layer 104, such as a fully depleted photodiode, no kTC noise appears when the gate of the transfer transistor 103 is turned off. Thus, excellent quality signal charges can be obtained.

As described above, according to the present embodiment, it is possible to realize the solid-state imaging device capable of maintaining endurance reliability against the electric field near the gate electrode while suppressing deterioration in image quality due to blooming.

Second Embodiment

A solid-state imaging device and a method of driving the same according to a second embodiment of the present invention will be described with reference to FIG. 4 and FIG. 5. Similar components as those in the solid-state imaging device and the method of driving the same according to the first embodiment illustrated in FIG. 1 to FIG. 3 are denoted by the same reference symbols, and the description thereof is omitted or simplified.

Figure 4:
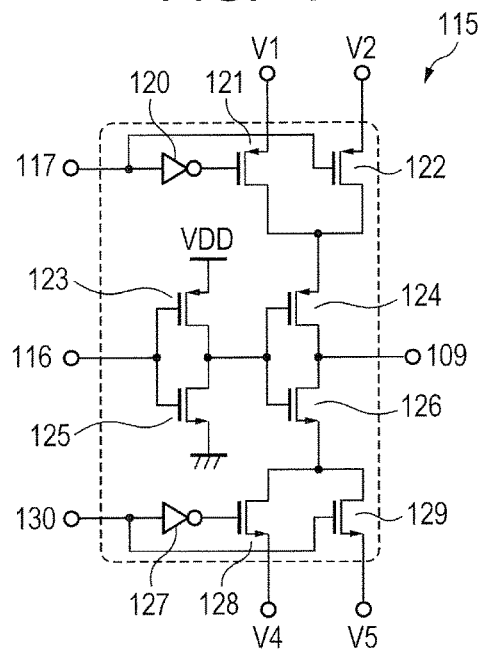
FIG. 4 is a diagram for illustrating an example of a reset control circuit of a solid-state imaging device according to a second embodiment of the present invention.
Figure 5:
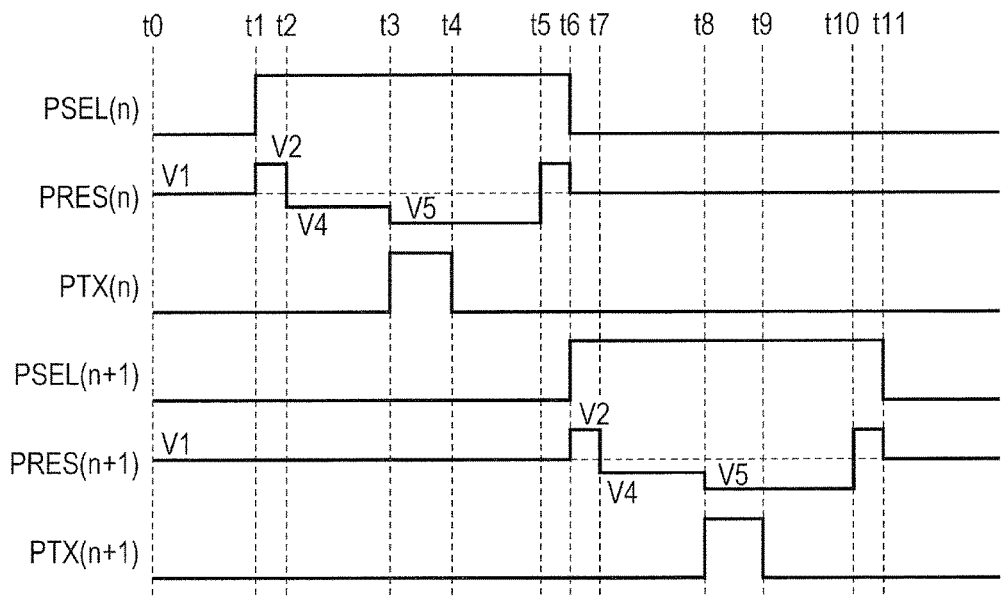
FIG. 5 is a timing chart for illustrating a method of driving the solid-state imaging device according to the second embodiment of the present invention.

FIG. 4 is a diagram for illustrating an example of the reset control circuit of the solid-state imaging device according to the present embodiment. FIG. 5 is a timing chart for illustrating the method of driving the solid-state imaging device according to the present embodiment.

First, the structure of the solid-state imaging device according to the present embodiment is described with reference to FIG. 4.

The solid-state imaging device according to the present embodiment is similar to the solid-state imaging device according to the first embodiment except that a reset control circuit 115 has a different structure. The reset control circuit 115 of the present embodiment further includes, in addition to the components of the reset control circuit 115 of the first embodiment, a power supply switching circuit configured to switch a voltage at a low level to be supplied to the inverter circuit of the output stage of the buffer circuit. That is, the reset control circuit 115 of the present embodiment is similar to the reset control circuit 115 of the first embodiment except that, as illustrated in FIG. 4, this power supply switching circuit is connected to the source of the n-channel MOS transistor 126 instead of the voltage supply terminal V3.

The power supply switching circuit configured to switch a voltage at a low level to be supplied to the inverter circuit of the output stage of the buffer circuit includes an inverter 127, n-channel MOS transistors 128 and 129, an input terminal 130, and voltage supply terminals V4 and V5. A predetermined control signal is output to the input terminal 130 from the vertical scanning circuit 114. The input terminal 130 is connected to a gate of the re-channel MOS transistor 129. Further, the input terminal 130 is connected to a gate of the n-channel MOS transistor 128 via the inverter 127. Drains of the n-channel MOS transistors 128 and 129 are connected to a source of the re-channel MOS transistor 126. A source of the n-channel MOS transistor 128 is connected to the voltage supply terminal V4. A source of the n-channel MOS transistor 129 is connected to the voltage supply terminal V5.

As described above, the reset control circuit 115 of the present embodiment further includes the power supply switching circuit configured to switch a voltage at a low level to be supplied to the inverter circuit of the output stage of the buffer circuit. With this, the reset control circuit 115 outputs any one of the voltage V1, the voltage V2, the voltage V4, and the voltage V5 from the output terminal 109 based on three inputs from the vertical scanning circuit 114 to the input terminal 116, the input terminal 117, and the input terminal 130. The voltage V1, the voltage V2, the voltage V4, and the voltage V5 have a relationship of V5<V4<V1<V2.

Next, the method of driving the solid-state imaging device according to the present embodiment is described with reference to FIG. 5.

In the method of driving the solid-state imaging device according to the present embodiment, in the period from time t2 to time t3 corresponding to the readout period of the N signal of the pixel 101 in the n-th row, the vertical scanning circuit 114 sets the reset gate control line 109(n) to the voltage V4 with the reset control circuit 115. Further, in the period from time t3 to time t5, which includes the readout period of the S signal, the vertical scanning circuit 114 sets the reset gate control line 109(n) to the voltage V5 with the reset control circuit 115. The same holds true for pixels in other rows. For example, the same control is performed in the period from time t7 to time t10 corresponding to the readout period of the pixel 101 in the (n+1)-th row. Control that is performed in other periods is similar to that in the method of driving the solid-state imaging device according to the first embodiment.

The voltage V4 is equal to or lower than the voltage V1 that is applied in the charge accumulation period, and is set as a voltage that is applied to the gate of the reset transistor 105 in the readout period of the N signal. With this, when strong light such as sunlight enters the floating diffusion layer 104, potential drop due to generation of a photocurrent through photoelectric conversion at the p-n junction forming the floating diffusion layer 104 can be suppressed. This has an effect to suppress deterioration in image quality such as that a black dot appears at the center of the sun on an image due to a photocurrent generated with light having large intensity.

The voltage V5 has a potential lower than the voltage V4, and is set as a voltage that is applied to the gate of the reset transistor 105 in the readout period of the S signal. The voltage V5 is set to a minimum necessary value that does not affect a signal voltage converted from signal charges in the floating diffusion layer 104. This has an effect to suppress a smear phenomenon in a lateral direction that is caused when voltage amplitude equal to or larger than saturation levels of image signals occurs due to strong light, and a power supply potential and a ground potential are deviated, with the result that false signals are superimposed on rows that are read at once.

As described above, according to the present embodiment, it is possible to provide the solid-state imaging device capable of maintaining endurance reliability against the electric field near the gate electrode while suppressing deterioration in image quality due to blooming. Further, it is possible to suppress deterioration in image quality due to entrance of light having large intensity such as sunlight.

Third Embodiment

Figure 6:
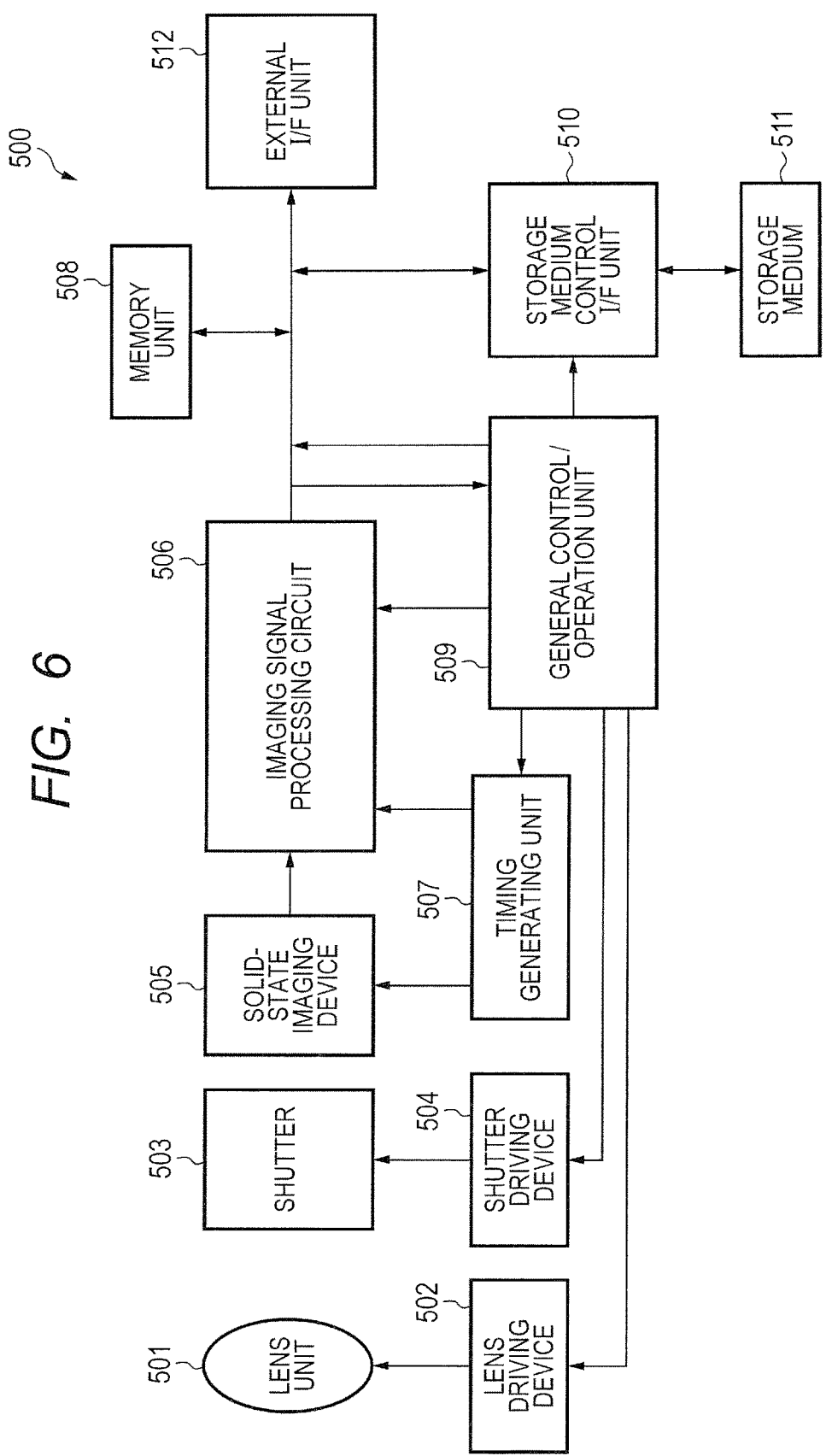
FIG. 6 is a block diagram for illustrating a configuration example of an imaging system according to a third embodiment of the present invention.

An imaging system according to a third embodiment of the present invention will be described with reference to FIG. 6. FIG. 6 is a block diagram for illustrating a configuration example of the imaging system according to the present embodiment.

An imaging system 500 according to the present embodiment is applicable to, although not particularly limited to, for example, a digital still camera, a digital camcorder, a camera head, a copying machine, a fax machine, a cell phone, an on-vehicle camera, an observation satellite, or the like.

The imaging system 500 includes, as illustrated in FIG. 6, a lens unit 501, a lens driving device 502, a shutter 503, a shutter driving device 504, a solid-state imaging device 505, an imaging signal processing circuit 506, and a timing generating unit 507. Further, the imaging system 500 includes a memory unit 508, a general control/operation unit 509, a storage medium control I/F unit 510, and an external I/F unit 512.

The solid-state imaging device 505 is the solid-state imaging device according to the first or second embodiment described above. The lens unit 501 is an optical system configured to form an optical image of an object on the solid-state imaging device 505. The lens driving device 502 is configured to perform zoom control, focus control, and stop control of the lens unit 501. The shutter 503 is a mechanical shutter and is controlled by the shutter driving device 504. The object image formed by the lens unit 501 is taken in by the solid-state imaging device 505 as image signals. The imaging signal processing circuit 506 is configured to perform various corrections on the image signals output from the solid-state imaging device 505, and compress data of the image signals. The timing generating unit 507 is configured to output various timing signals to the solid-state imaging device 505 and the imaging signal processing circuit 506. The general control/operation unit 509 is a control circuit configured to perform various operations and control the entire imaging system 500. The memory unit 508 is configured to temporarily store the image data output from the imaging signal processing circuit 506. The storage medium control I/F unit 510 is an interface configured to store or read out the image data in or from the storage medium 511. The storage medium 511 is configured to store or read out the image data and is, for example, a removable semiconductor memory. The external I/F unit 512 is an interface unit configured to communicate to/from an external computer and the like.

Next, operation of the imaging system according to the present embodiment is described.

When the main power of the imaging system is turned on, the control systems are powered on, and the imaging system circuits such as the imaging signal processing circuit 506 are also powered on.

Next, when a release button (not illustrated) is pressed, a distance measurement calculation is performed based on data output from the solid-state imaging device 505, and a distance to an object is calculated by the general control/operation unit 509 based on a result of the distance measurement. After that, the lens unit 501 is driven by the lens driving device 502 and it is determined whether or not the lens unit 501 is in focus. When the lens unit 501 is determined to be out of focus, the lens unit 501 is driven again and the distance measurement is performed. The distance measurement calculation may be performed with the use of data output from a device dedicated for distance measurement (not shown) other than the data output from the solid-state imaging device 505.

Then, after it is confirmed that the lens unit 501 is in focus, photographing operation is started. When the photographing operation is finished, image signals output from the solid-state imaging device 505 are subjected to image processing by the imaging signal processing circuit 506, and are written in the memory unit 508 by the general control/operation unit 509. In the imaging signal processing circuit 506, sorting processing and addition processing, and selection processing therefor are performed. The data accumulated in the memory unit 508 is recorded in the storage medium 511 via the storage medium control I/F unit 510 through the control by the general control/operation unit 509. The image signals subjected to the image processing by the imaging signal processing circuit 506 may be directly input to a computer and the like via the external I/F unit 512 to be subjected to image editing.

The imaging system to which the solid-state imaging device according to the first or second embodiment is applied is formed in this way, thereby being capable of realizing the highly reliable imaging system capable of obtaining a high quality image in which deterioration in image quality due to blooming and the like is suppressed.

Modified Embodiment

The present invention is not limited to the above-mentioned embodiments and various modifications can be made thereto.

For example, in the first embodiment described above, the magnitude relationship between the voltage V1, the voltage V2, and the voltage V3 is V3<V1<V2. However, this magnitude relationship is satisfied when the reset transistors 105 are formed of the n-channel MOS transistors. When the reset transistors 105 are formed of p-channel MOS transistors, the magnitude relationship of those voltages is V3>V1>V2. The above description can be summarized as follows: the voltage V1 is a voltage between the voltage V2 and the voltage V3.

Further, in the second embodiment described above, when the voltage V3 includes the voltage V4 and the voltage V5, the magnitude relationship between the voltage V4 and the voltage V5 is V5<V4. However, this magnitude relationship is satisfied when the reset transistors 105 are formed of the n-channel MOS transistors. When the reset transistors 105 are formed of p-channel MOS transistors, the magnitude relationship of those voltages is V5>V4. The above description can be summarized as follows: the voltage V4 is a voltage between the voltage V1 and the voltage V5.

Further, in the above-mentioned embodiments, a level of a voltage that is applied to the gate of the transfer transistor 103 includes a low level and a high level, but a potential at a low level may be set to be lower than the ground potential so as to reduce a dark current that flows into the photoelectric conversion element 102 in the charge accumulation period. When a voltage that is applied to the gate of the transfer transistor 103 in this case is a voltage V6, a magnitude relationship between the voltage V6 and other voltages is V6<V3<V1. When the transfer transistors 103 are formed of the P-channel MOS transistors, the magnitude relationship of those voltages is V6>V3>V1. The above description can be summarized as follows: the voltage V3 is a voltage between the voltage V6 and the voltage V1.

Further, the circuit configuration of the pixel 101 illustrated in FIG. 1 is an example, and pixel circuits applicable to the solid-state imaging device of the present invention are not limited thereto. Further, the circuit configuration of the reset control circuit 115 is not limited to the circuit configurations illustrated in FIG. 2 and FIG. 4 as long as a desired voltage switching function can be realized.

Further, the imaging system according to the third embodiment is an example of imaging systems to which the solid-state imaging device of the present invention is applicable, and the imaging systems to which the solid-state imaging device of the present invention is applicable are not limited to the configuration illustrated in FIG. 6.

Further, the specific examples of voltage and current described in the above-mentioned embodiments are exemplified for the sake of convenience of the description. Values of the voltage and the current are not limited to the specific examples, and supposed to be properly set depending on characteristics of transistors and the like.

Embodiment(s) of the present invention can also be realized by a computer of a system or apparatus that reads out and executes computer-executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer-executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer-executable instructions. The computer-executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-055877, filed Mar. 19, 2015, which is hereby incorporated by reference herein in its entirety.

What is claimed is:

1. A solid-state imaging device comprising:
 a pixel including:
  a photoelectric conversion element;
  a floating diffusion layer;
  a transfer transistor configured to transfer charges generated in the photoelectric conversion element to the floating diffusion layer;
  a reset transistor configured to reset a potential of the floating diffusion layer; and
  an amplifier transistor configured to output a signal based on the potential of the floating diffusion layer; and
 a control unit configured to:
  supply a first voltage to a gate of the reset transistor when charges are accumulated in the photoelectric conversion element, the first voltage being a voltage between a second voltage and a third voltage;
  subsequently supply the second voltage to the gate of the reset transistor when the reset transistor is turned on in order to reset the potential of the floating diffusion layer; and
  subsequently supply the third voltage to the gate of the reset transistor when the amplifier transistor outputs the signal based on the potential of the floating diffusion layer.

2. The solid-state imaging device according to claim 1, wherein
 the second voltage is a voltage for controlling the reset transistor so that the reset transistor has a first ON resistance, and
 the first voltage is a voltage for controlling the reset transistor so that the reset transistor has a second ON resistance higher than the first ON resistance.

3. The solid-state imaging device according to claim 2, wherein
 the reset transistor is controlled to have the first ON resistance so that the floating diffusion layer is reset to have a same potential as a voltage of a power supply connected to a drain of the reset transistor.

4. The solid-state imaging device according to claim 1, wherein
 the reset transistor is a depletion transistor, and
 the second voltage is a same voltage as a reset power supply voltage that is used for resetting the floating diffusion layer.

5. The solid-state imaging device according to claim 1, wherein
 the third voltage includes a fifth voltage and a fourth voltage between the first voltage and the fifth voltage, and
 the control unit is further configured to:

supply the fourth voltage to the gate of the reset transistor when the amplifier transistor outputs an N signal; and supply the fifth voltage to the gate of the reset transistor when the amplifier transistor outputs an S signal.

6. The solid-state imaging device according to claim 1, wherein the reset transistor is configured to become an OFF state when the third voltage is supplied to the gate.

7. The solid-state imaging device according to claim 1, wherein the control unit is further configured to supply a sixth voltage to a gate of the transfer transistor when the transfer transistor is set to an OFF state, and the third voltage is a voltage between the first voltage and the sixth voltage.

8. The solid-state imaging device according to claim 1, wherein the pixel further includes a select transistor configured to select the pixel.

9. The solid-state imaging device according to claim 1, wherein the control unit comprises:
a buffer circuit; and
a switching circuit configured to selectively supply the first voltage and the second voltage to the buffer circuit.

10. The solid-state imaging device according to claim 9, wherein the buffer circuit includes an inverter circuit including an n-channel transistor and a p-channel transistor, the switching circuit includes two switches configured to mutually exclusively operate, and the buffer circuit is connected, via one of the two switches, to a first voltage supply terminal configured to supply the first voltage, and is connected, via another one of the two switches, to a second voltage supply terminal configured to supply the second voltage.

11. A solid-state imaging device comprising:
a pixel including:
a photoelectric conversion element;
a floating diffusion layer;
a transfer transistor configured to transfer charges generated in the photoelectric conversion element to the floating diffusion layer;
a reset transistor configured to reset a potential of the floating diffusion layer; and
an amplifier transistor configured to output a signal based on the potential of the floating diffusion layer; and
a control unit configured to:
supply a first voltage to a gate of the reset transistor when charges are accumulated in the photoelectric conversion element, the first voltage being a voltage between a second voltage and a third voltage;
subsequently supply the second voltage to the gate of the reset transistor when the reset transistor is turned on in order to reset the potential of the floating diffusion layer; and
subsequently supply the third voltage to the gate of the reset transistor when the transfer transistor is transferring the charges.

12. The solid-state imaging device according to claim 11, wherein the second voltage is a voltage for controlling the reset transistor so that the reset transistor has a first ON resistance, and the first voltage is a voltage for controlling the reset transistor so that the reset transistor has a second ON resistance higher than the first ON resistance.

13. The solid-state imaging device according to claim 12, wherein the reset transistor is controlled to have the first ON resistance so that the floating diffusion layer is reset to have a same potential as a voltage of a power supply connected to a drain of the reset transistor.

14. The solid-state imaging device according to claim 11, wherein the reset transistor is a depletion transistor, and the second voltage is a same voltage as a reset power supply voltage that is used for resetting the floating diffusion layer.

15. The solid-state imaging device according to claim 11, wherein the third voltage includes a fifth voltage and a fourth voltage between the first voltage and the fifth voltage, and the control unit is further configured to:
supply the fourth voltage to the gate of the reset transistor when the amplifier transistor outputs an N signal; and
supply the fifth voltage to the gate of the reset transistor when the amplifier transistor outputs an S signal.

16. The solid-state imaging device according to claim 11, wherein the reset transistor is configured to become an OFF state when the third voltage is supplied to the gate.

17. The solid-state imaging device according to claim 11, wherein the control unit is further configured to supply a sixth voltage to a gate of the transfer transistor when the transfer transistor is set to an OFF state, and the third voltage is a voltage between the first voltage and the sixth voltage.

18. The solid-state imaging device according to claim 11, wherein the pixel further comprises a select transistor configured to select the pixel.

19. The solid-state imaging device according to claim 11, wherein the control unit comprises:
a buffer circuit; and
a switching circuit configured to selectively supply the first voltage and the second voltage to the buffer circuit.

20. The solid-state imaging device according to claim 19, wherein the buffer circuit includes an inverter circuit including an n-channel transistor and a p-channel transistor, the switching circuit includes two switches configured to mutually exclusively operate, and the buffer circuit is connected, via one of the two switches, to a first voltage supply terminal configured to supply the first voltage, and is connected, via another one of the two switches, to a second voltage supply terminal configured to supply the second voltage.

21. An imaging system, comprising:
a solid-state imaging device comprising:
a pixel including:
a photoelectric conversion element;
a floating diffusion layer;
a transfer transistor configured to transfer charges generated in the photoelectric conversion element to the floating diffusion layer;

a reset transistor configured to reset a potential of the floating diffusion layer; and an amplifier transistor configured to output a signal based on the potential of the floating diffusion layer; and a control unit configured to:

supply a first voltage to a gate of the reset transistor when charges are accumulated in the photoelectric conversion element, the first voltage being a voltage between a second voltage and a third voltage;

subsequently supply the second voltage to the gate of the reset transistor when the reset transistor is turned on in order to reset the potential of the floating diffusion layer; and subsequently supply the third voltage to the gate of the reset transistor in at least one of a case where the amplifier transistor outputs the signal based on the potential of the floating diffusion layer, or a case where the transfer transistor is transferring the charges; and an optical system configured to form an optical image of an object on the solid-state imaging device.

* * * * *